US012089383B2

(12) United States Patent
Witherspoon et al.

(10) Patent No.: US 12,089,383 B2
(45) Date of Patent: Sep. 10, 2024

(54) EXPANSION JOINT SEALING SYSTEM HAVING SHIELDING PROPERTIES

(71) Applicant: SIKA TECHNOLOGY AG, Baar (CH)

(72) Inventors: William Witherspoon, Guelph (CA); Lester Hensley, Westborough, MA (US)

(73) Assignee: SIKA TECHNOLOGY AG, Baar (CH)

( * ) Notice: Subject to any disclaimer, the term of this patent is extended or adjusted under 35 U.S.C. 154(b) by 0 days.

(21) Appl. No.: 17/635,798

(22) PCT Filed: Aug. 17, 2020

(86) PCT No.: PCT/US2020/046684
§ 371 (c)(1),
(2) Date: Feb. 16, 2022

(87) PCT Pub. No.: WO2021/034768
PCT Pub. Date: Feb. 25, 2021

(65) Prior Publication Data
US 2022/0295676 A1 Sep. 15, 2022

Related U.S. Application Data

(60) Provisional application No. 62/887,877, filed on Aug. 16, 2019.

(51) Int. Cl.
*H05K 9/00* (2006.01)
*E04B 1/68* (2006.01)
*E04B 1/94* (2006.01)

(52) U.S. Cl.
CPC ......... *H05K 9/0015* (2013.01); *E04B 1/6812* (2013.01); *E04B 1/948* (2013.01)

(58) Field of Classification Search
CPC .................. H05K 9/0015; H05K 9/0009
See application file for complete search history.

(56) References Cited

U.S. PATENT DOCUMENTS

| 4,857,668 A | 8/1989 | Buonanno |
| 6,410,846 B1 | 6/2002 | Benn, Jr. |

(Continued)

FOREIGN PATENT DOCUMENTS

| JP | 116213 A | 1/1999 |
| WO | 2019008231 A1 | 1/2019 |

OTHER PUBLICATIONS

International Search Report issued in corresponding PCT Application No. PCT/US2020/046684, dated Oct. 30, 2020.

(Continued)

*Primary Examiner* — Hung V Ngo
(74) *Attorney, Agent, or Firm* — Oliff PLC

(57) ABSTRACT

An expansion joint sealing system includes a core body having an EMP, EMI, RFI, electronic surveillance and/or EMR shielding/barrier material introduced in the core body as at least one of a component or layer, disposed on the core body as a coating or wrapping, or disposed beneath the core body. The core body with the shielding/barrier material is configured to expand and contract when compressed between substrates forming an expansion joint to accommodate movement of the substrates and maintain a seal of the expansion joint.

35 Claims, 6 Drawing Sheets

(56) References Cited

U.S. PATENT DOCUMENTS

| | | |
|---|---|---|
| 8,365,495 B1 | 2/2013 | Witherspoon |
| 2006/0180348 A1* | 8/2006 | Cloutier .............. H05K 9/0015 174/350 |
| 2006/0222774 A1* | 10/2006 | Flanders ................... C08J 9/40 427/430.1 |
| 2014/0360118 A1 | 12/2014 | Hensley et al. |

OTHER PUBLICATIONS

UL Standard for Safety for Tests for Fire Resistance of Building Joint Systems, UL 2079; Fourth Edition, Dated Oct. 21, 2004; revised Jun. 30, 2008.

UL Standard for Safety for Tests for Fire Resistance of Building Joint Systems, UL 2079; Fifth Edition, Dated Aug. 26, 2015; revised Jul. 29, 2020.

\* cited by examiner

EXPANSION JOINT SEALING SYSTEM HAVING SHIELDING PROPERTIES

CROSS REFERENCE TO RELATED APPLICATION

This patent application is a U.S. Non-Provisional Patent Application, which claims priority benefit under 35 U.S.C. § 371 to PCT Application No. PCT/US2020/046684, filed on Aug. 17, 2020, which claims the benefit of U.S. Provisional Patent Application No. 62/887,877 filed Aug. 16, 2019, the disclosures of which are incorporated by reference herein in their entireties.

TECHNICAL FIELD

The present invention relates generally to expansion joint sealing systems for use in architectural applications and, more particularly, to an expansion joint sealing system having, in addition to water and/or fire resistant properties, properties to shield against penetration of naturally occurring and/or man-made electromagnetic pulses (EMPs), electromagnetic interference (EMI), radio frequency interference (RFI), and electronic surveillance including the unauthorized interception of communication and/or electromagnetic radiation (EMR) emanating from computer and/or telecommunication devices, the sealing systems for use in building and construction systems and structures.

BACKGROUND

Building and construction applications in which materials such as concrete, metal, and glass are used typically employ expansion joint sealing systems to seal a space or gap (e.g., an expansion joint) between adjacent materials. The expansion joint sealing systems are designed to accommodate thermal expansion and contraction, movement due to shear or load forces, sway due to wind or seismic movement of the various materials, and/or intentional movement of various elements relative to each other. These expansion joint sealing systems may be positioned to extend through both the interior and exterior surfaces (e.g., walls, floors, and roofs) of a building or other structure. In the case of an exterior joint in an exterior wall, roof, or floor exposed to external environmental conditions, the expansion joint sealing system should also, to some degree, seal and/or resist the effects of such environmental conditions. As such, most exterior joints are designed to seal and resist the effects of water from penetrating the structure. In particular, vertically-oriented exterior joints are designed to resist penetration of water in the form of rain, snow, ice, or debris that is driven by wind. Horizontally-oriented joints are designed to resist penetration of water in the form of rain, standing water, snow, ice, debris such as sand, chemicals used to treat snow and ice covered surfaces, and in some circumstances all of these at the same time. Additionally, some horizontal systems may be subjected to pedestrian and/or vehicular traffic and are designed to withstand such traffic while providing the aforementioned sealing property.

In the case of interior joints, water tightness aspects are less of an issue than they are in exterior joints, and so expansion joint sealing products are often designed simply to accommodate building movement. However, interior horizontal joints may also be subject to pedestrian traffic and in some cases vehicular traffic as well.

It has been generally recognized that building expansion joint sealing systems are deficient with respect to fire resistance. In some instances, movement as a result of building joint sealing systems has been shown to create breaks or voids in the seal that result in chimney effects which can have consequences with regard to fire containment. This often results in the subversion of fire resistive elements that may be incorporated into the construction of a building. This problem is particularly severe in large highrise buildings, parking garages, and stadiums where fire may spread too rapidly to allow the structures to be evacuated.

Early designs for fire resistive expansion joint systems included monolithic blocks of mineral wool or other inorganic materials of either monolithic or composite constructions either in combination with or without a field-applied liquid sealant. In general, these designs were adequate for non-moving joints or control joints where movements were very small. Where movements were larger and the materials were significantly compressed during the normal thermal expansion cycles of the building structure, these designs generally did not function as intended. Indeed, many designs simply lacked the resilience or recovery characteristics required to maintain an adequate coverage/seal over the entire joint width throughout the normal thermal cycle (expansion and contraction) that buildings experience. Many of these designs were tested in accordance with accepted standards such as ASTM E-119, which provides for fire exposure testing of building components under static conditions and does not take into account the dynamic nature of expansion joint systems. As described above, this dynamic behavior can contribute to the compromise of the fire resistance properties of some building designs.

Underwriters Laboratories developed UL 2079, a further refinement of ASTM E-119, by adding a movement cycling regimen to the test. Additionally, U L 2079 stipulates that the design be tested at the maximum joint size. This test is more reflective of real world conditions, and as such, architects and engineers have begun requesting expansion joint products that meet it. Many designs which pass ASTM E-119 without the cycling regime do not pass UL 2079. This may be adequate, as stated above, for non-moving building joints; however, most building expansion joint sealing systems are designed to accommodate some movement as a result of thermal effects (e.g., expansion into the joint and contraction away from the joint) or as a result of seismic movement.

Both expansion joints and fire resistive expansion joints typically address either the water tightness aspects of the expansion joint sealing system or the fire resistive nature of the expansion joint sealing system, as described above, but not both.

Water resistant or water tight expansion joint sealing systems exist in many forms, but in general they are constructed from materials designed to resist water penetration during the mechanical cycling caused by movement of the building due to thermal effects. These designs do not have fire resistant properties in a sufficient fashion to meet even the lowest fire rating standards. Indeed, many waterproofing materials act as fuel for any fire present, which can lead to a chimney effect that rapidly spreads fire throughout a building.

Conversely, many fire rated expansion joint sealing systems do not have sufficient ability to resist water penetration to make them suitable for exterior applications. Many designs reliant upon mineral wool, ceramic materials and blankets, and intumescents, alone or in combination with each other, have compromised fire resistance if they come into contact with water. Additionally, as noted above, many fire rated designs cannot accommodate the mechanical cycling due to thermal effects without compromising the fire resistance.

This has resulted in the installation of two sealing systems for each expansion joint where both a fire rating and water resistance is required. In many cases, there simply is not sufficient room in the physical space occupied by the expansion joint to accommodate both a fire rated sealing system and a water resistant sealing system. In instances where the physical accommodation can be made, the resultant installation involves two products, with each product requiring its own crew of trained installers. Care is exercised such that one installation does not compromise the other.

Many systems also require on-site assembly to create a finished expansion joint sealing system. This is arguably another weakness, as an incorrectly installed or constructed system may compromise fire and water resistant properties of the desired continuous seal. In some cases, these fire resistant expansion joint sealing systems are invasively anchored to the substrate (which may be concrete). Over time, the points at which such systems are anchored are subject to cracking and ultimately spalling, which may subvert the effectiveness of the fire resistance by simply allowing the fire to go around the fire resistant elements of the system.

Many expansion joint sealing products do not fully consider the irregular nature of building expansion joints. It is quite common for an expansion joint to have several areas of transition of planes (e.g., horizontal to vertical) areas along its length. These may be walls, parapets, columns or other obstructions. As such, the expansion joint sealing product, in some fashion or other, follows the joint. In many products, this is a point of weakness, as the homogeneous nature of the product and continuous seal, is interrupted. Methods of handling these transitions include stitching, gluing, and welding. All of these are weak spots from both a water resistance aspect and a fire resistance aspect.

In addition to the aforementioned need to seal an expansion joint in building structures by providing an expansion joint sealing system that has water and/or fire resistant properties, there is a need and/or desire to insulate the building structure from penetration of naturally occurring and/or man-made electromagnetic pulses (EMPs), electromagnetic interference (EMI), radio frequency interference (RFI), and electronic surveillance including the unauthorized interception of communication and/or electromagnetic radiation (EMR) emanating from computer and/or telecommunication devices. Various governmental and/or civilian directives and standards define requirements for appropriate shielding to establish structures such as, for example, a Sensitive Compartmented Information Facility (SCIF), and/or guarding against transmissions/emissions from a structure or areas therein in accordance with a Telecommunications Electronics Material Protected from Emanating Spurious Transmissions (TEMPEST) or Emissions Security (Emsec). National Communications Security Committee Directive 4 sets some U.S. TEMPEST standards. Conventional designs for systems to shield from such penetration and/or detection of such transmissions/emission include forming a so called "room within a room" or vault structure in the interior of building structure that is surrounded by welded or soldered metal plates, mesh or foil of steel, cooper, aluminum or other materials. This design is inherently expensive both in terms of material and/or installation cost, or if even usable in a particular application of use, suffers from failure (e.g., voids, cracks, rips, or tears), when exposed to contact with other materials or high movement as is the norm within a building expansion joint seal use. As a result, there is a need for an efficient and effective expansion joint sealing system having, in addition to water and/or fire resistant properties, properties to shield against penetration of naturally occurring and/or man-made EMPs, EMI, RFI, and/or electronic surveillance.

SUMMARY OF THE INVENTION

In one aspect, the present invention resides in a fire resistant and/or water resistant expansion joint sealing system comprised of a foam or core body; and a fire retardant is introduced in or infused into the body. The foam or core body introduced or infused with the fire retardant is configured to define a profile to facilitate compression of the fire and/or water resistant expansion joint sealing system when installed between substantially coplanar substrates.

In another aspect, the present invention resides in a fire and/or water resistant architectural joint sealing system comprising first and second substrates arranged to be at least substantially coplanar and an expansion joint located in compression therebetween. The expansion joint sealing system comprises a foam or a core body having a fire retardant introduced in or infused into the body, wherein a layer is sandwiched between the material of the foam or core body, and the foam or core body is not coated with any fire retardant material on any outer surface of the foam or core body. In one embodiment, the layer is comprised of fire retardant material. In another embodiment, the layer is comprised of a shielding material. In one embodiment, the shielding material insulates from or provides a barrier against penetration of naturally occurring and/or man-made EMPs, EMI, RFI, and electronic surveillance including the unauthorized interception of communication and/or EMR emanating from computer and/or telecommunication devices.

In another aspect, the present invention resides in a fire and/or water resistant architectural joint sealing system comprising first and second substrates arranged to be at least substantially coplanar and an expansion joint sealing system located in compression between the substrates. The expansion joint sealing system comprises a foam or a core body material having a fire retardant introduced in or infused into the body. Upon compression of the expansion joint sealing system and within its location between the substrates, the expansion joint sealing system accommodates movement between the substrates while imparting fire resistance and/or water resistance.

In another aspect, the present invention resides in a method of installing a fire and/or water resistant expansion joint sealing system. In the method of installing such a joint sealing system, first and second substrates are provided in at least a substantially coplanar arrangement such that a gap is formed between the edges thereof. A fire and/or water resistant expansion joint sealing system comprises a foam or a core body with a fire retardant introduced in or infused into the body, the joint sealing system is compressed and inserted into the gap between the substrates and allowed to expand to fill the gap.

In one embodiment of the joint sealing systems described herein, an elastomer material, e.g., provides for waterproofing or water resistance, a fire barrier sealant including an intumescent material provides for fire resistance, and the fire retardant infused foam or core body provides for both fire and water resistance, and movement properties. The materials and layers described herein can be assembled and arranged in any suitable order/combination to provide the desired fire and/or water resistant (and/or waterproofing) properties in any desired direction. For example, the materials can be assembled so as to offer waterproofing or water resistance in one direction and/or fire resistance in the other direction (e.g., an asymmetrical configuration) or, e.g., in a fashion that offers both waterproofing (or water resistance) and fire resistance in both directions (a symmetrical configuration) through the building joint, or any other desired directions/combinations thereof. The system is delivered to the job site in a pre-compressed state ready for installation into the building joint.

The expansion joint sealing systems and architectural joint sealing systems of the present invention provide a substantially resilient fire resistant and/or water resistant mechanism that is able to accommodate thermal, seismic, and other building movements while maintaining one or both fire and water resistance characteristics.

In still another aspect, the expansion joint sealing systems and the architectural joint sealing systems of the present invention provide shielding to insulate or provide a barrier in the building structure from penetration of naturally occurring and/or man-made EMPs, EMI, RFI, and electronic surveillance including the unauthorized interception of communication, transmission and/or EMR emanating from computer and/or telecommunication devices. In one embodiment, the shielding or barrier is provided by a layer. For example, the aforementioned layer sandwiched between the material of the foam or core body. In another embodiment, a choice of chemistry used to form a foam within a foaming process, or chemistry used as an infusion/impregnation composition, provides shielding or barrier properties. In yet another embodiment, a fabric or coating is applied to a surface of the foam or core body, or disposed within the foam or core body, to provide the shielding or barrier properties. In still another embodiment, a fabric is disposed outside of the foam or core body, e.g., draped behind or under the expansion joint sealing system to provide the shielding or barrier properties below the system.

BRIEF DESCRIPTION OF THE DRAWINGS

FIG. 1A is a partial, schematic view of the expansion joint sealing system of FIG. 1;

DESCRIPTION OF THE INVENTION

The expansion joint sealing system described is best understood by referring to the attached drawings. The expansion joint sealing system as described herein is shown as being installed between concrete substrates. The present invention is not limited in this regard, however, as the expansion joint sealing system may be installed between substrates or surfaces other than concrete. Materials for such substrates or surfaces include, but are not limited to, glass, asphalt, stone (granite, marble, etc.), metal, and the like.

Figure 1:
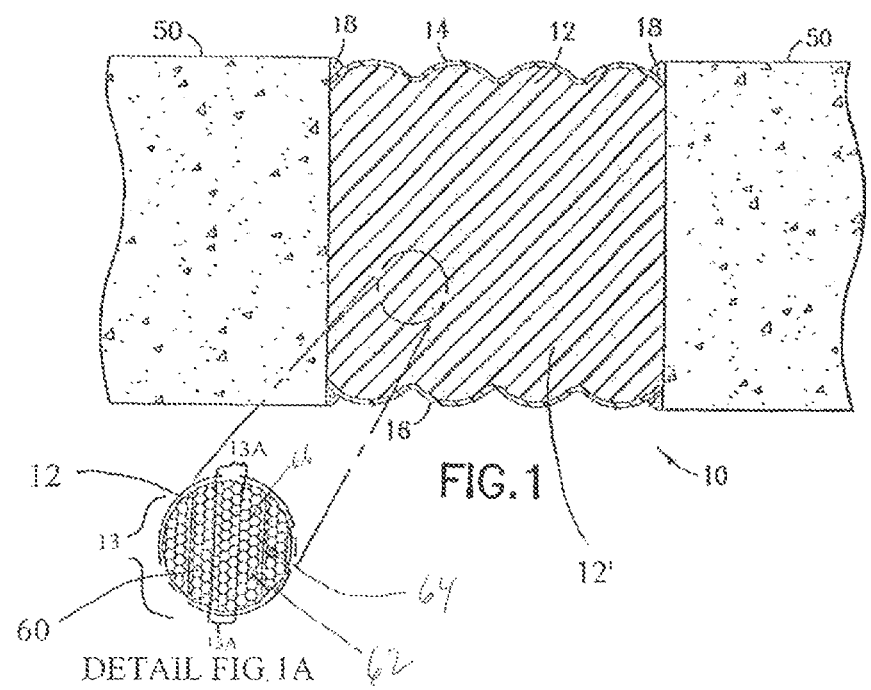
FIG. 1 is a schematic view of one embodiment of an expansion joint sealing system of the present invention.

Referring to FIG. 1, one embodiment of an expansion joint sealing system is shown at 10 and is hereinafter referred to as "system 10." In system 10, a core body 12' comprises compressed laminations 13 of open celled polyurethane foam 12 (hereinafter referred to as "foam 12" for ease of reference which is not meant to limit the core body 12' to a foam material, but merely illustrate one exemplary material therefore). In one embodiment, a material 60 (described below) is introduced in or infused into the foam 12 (as illustrated in Detail FIG. 1A) to form the defined expansion joint locatable between coplanar concrete substrates 50 having one or more water resistant, fire resistant and/or shielding/barrier characteristics. As stated above, the present invention is not limited to the use of polyurethane foams, as other foams are within the scope of the present invention, and other non-foam materials also can be used for the core body 12', as explained below. The individual laminations 13A extend substantially perpendicular to the direction in which the joint extends and are constructed by introducing or infusing at least one, e.g., an inner lamination with an amount of the material 60. However, the structures of the present invention are also not limited in this regard as, e.g., the foam 12 and/or core body 12' may comprise a solid block of non-laminated foam or other material of fixed size depending upon the desired joint size, a laminate comprising laminations oriented parallel to the direction in which the joint extends, or combinations of the foregoing.

Thus, foam 12 merely illustrates one suitable material for the core body 12'. Accordingly, examples of materials for the core body 12' include, but are not limited to, foam, e.g., polyurethane foam and/or polyether foam, and can be of an open cell or dense, closed cell construction. Further examples of materials for the core body 12' include paper based products, cardboard, metal, plastics, thermoplastics, dense closed cell foam including polyurethane and polyether open or closed cell foam, cross-linked foam, neoprene foam rubber, urethane, ethyl vinyl acetate (EVA), silicone, a core chemistry (e.g., foam chemistry) which inherently imparts hydrophobic, fire resistant and/or EMP, EMI, RFI, electronic surveillance and/or EMR shielding/barrier characteristics to the core body; and/or composites. Combinations of any of the foregoing materials or other suitable materials also can be employed. It is further noted that while foam 12 is primarily referred to herein as a material for the core body 12', the descriptions for foam 12 also can apply to other materials for the core body 12', as explained above.

The core body 12' can be infused with a suitable material 60, and/or the suitable material 60 can be introduced in the core body 12'. The suitable material 60 may include, but not limited to, an acrylic 62, such as a water-based acrylic chemistry, a wax, a fire retardant material 64, ultraviolet (UV) stabilizers, and/or polymeric materials, a material providing EMP, EMI, RFI, electronic surveillance and/or EMR shielding/barrier characteristics, combinations thereof, and so forth. In one embodiment, the core body 12' comprises an open celled foam infused with a water-based acrylic chemistry 62 and/or a fire retardant material 64. In another embodiment, the core body 12' including or infused with the water-based acrylic chemistry 62 and/or a fire retardant material 64, further has EMP, EMI, RFI, electronic surveillance and/or EMR shielding/barrier characteristics by, for example, adding a suitable coating or layer, or infusion or impregnation composition 66 having such addition characteristics is introduced therein. Alternatively, the core body 12' includes or is infused with only the material providing EMP, EMI, RFI, electronic surveillance and/or EMR shielding/barrier characteristics.

The amount of the water resistant chemistry 62, fire retardant material 64 and/or shielding/barrier composition 66 introduced in or infused into the core body 12', including the open celled foam embodiment, varies in comparison to the un-infused foam/core body itself, according to embodiments. The resultant uncompressed foam/core, whether comprising a solid block or laminates, has a density of about 130 kg/m$^3$ to about 150 kg/m$^3$ and preferably about 140 kg/m$^3$. Other suitable densities for the infused core body 12' include between about 50 kg/m$^3$ and about 250 kg/m$^3$, e.g., between about 100 kg/m$^3$ and about 180 kg/m$^3$, and which are capable of providing desired water resistance and/or fire resistance and/or EMP, EMI, RFI, electronic surveillance and/or EMR shielding/barrier characteristics to the structure. It should be appreciated that the present invention is not limited in this regard, however, as other densities may be used to provide the water resistance, fire resistance and/or shielding/barrier properties without adversely affecting the expansion joint sealing system's ability to cycle (expand and contract) to accommodate the movement of substrates between which the system is compressed to maintain the seal. For example, acceptable or preferred performance of expansion joint sealing systems 10 designed in accordance with the present invention requires a balance of a backpressure provided by the organic structure of the un-infused, un-impregnated foam 12 and/or core body 12' (e.g., the organic cellular structure of the un-infused foam or core) and an amount of a component (liquid or solid) put into the organic structure by introduction, by infusion, by impregnation and other equivalent processes, as the amount of the component put into the structure, whether it is the water resistant chemistry 62, the fire retardant material 64, or the shielding/barrier composition 66, affects the degree to which the backpressure of the un-introduced, un-infused, or un-impregnated, foam or core body is dampened or restrained by the component. As such, the amount of the component introduced, infused or impregnated must not adversely affect the system's ability to cycle (expand and contract) to accommodate the movement of substrates between which the system is compressed to maintain the seal provided by the expansion joint sealing system.

One type of fire retardant material 64 that may be used is water-based aluminum tri-hydrate (also known as aluminum tri-hydroxide (ATH)). The present invention is not limited in this regard, however, as other fire retardant materials may be used. Such materials include, but are not limited to, expandable graphite and/or other carbon-based derivatives that may impart fire resistance or retardation, metal oxides and other metal hydroxides, aluminum oxides, antimony oxides and hydroxides, iron compounds such as ferrocene, molybdenum trioxide, nitrogen-based compounds, phosphorus based compounds, halogen based compounds, halogens, e.g., fluorine, chlorine, bromine, iodine, astatine, compounds capable of suppressing combustion and smoke formation, and combinations of any of the foregoing materials. The present invention is not limited in this regard, however, as other fire retardant materials may be used. One type of shielding/barrier composition 66 that may be used is, for example, aluminum, copper, graphite, silver, boron, gold, silver-plated aluminum, nickel-plated graphite, and other similar materials having superior conductivity. The present invention is not limited in this regard, however, as other shielding/barrier materials may be used.

Several laminations of the polyurethane foam or other suitable material, the number depending on the desired size of the expansion joint sealing system, are compiled and then compressed and held at such compression in a suitable fixture, according to embodiments. Similarly, a core body 12' comprising laminations of non-foam material or comprising a solid block of desired material may be compiled and then compressed and held at such compression in a suitable fixture. The fixture is at a width slightly greater than that which the expansion joint is anticipated to experience at the largest possible movement of the adjacent concrete surfaces. At this width, the infused foam laminate or core body 12' is coated with a coating, such as a water resistant elastomer 14 at one or more surfaces, according to embodiments. This water resistant elastomer 14 may be a polysulfide, silicone, acrylic, polyurethane, poly-epoxide, silyl-terminated polyether, a formulation of one or more of the foregoing materials with or without other elastomeric components or similar suitable elastomeric coating or liquid sealant materials, or a mixture, blend, or other formulation of one or more of the foregoing. One preferred elastomer coating for application to a horizontal deck where vehicular traffic is expected is Sikasil® WS-295 sealant, which is a silicone sealant available from Sika Corporation of Lyndhurst, N.J. Another elastomer coating is Pecora 301, which is a silicone pavement sealant available from Pecora Corporation of Harleysville, Pa. Yet another elastomeric coating is Dow Corning 888, which is a silicone joint sealant available from Dow Corning Corporation of Midland, Mich. Each of the foregoing elastomers are traffic grade rated sealants. For vertically-oriented expansion joints, exemplary preferred elastomer coatings include Sikasil WS-295, Pecora 890, Dow Corning 790, and Dow Corning 795.

Depending on the nature of the adhesive characteristics of the elastomer 14, a primer may be applied to the outer surfaces of the laminations of foam 12 and/or core body 12' prior to the coating with the elastomer 14. Applying such a primer may facilitate the adhesion of the elastomer 14 to the foam 12 and/or core body 12'. In one embodiment, the coating of the elastomer 14 is tooled or otherwise configured to create a "bellows," "bullet," or other suitable profile such that the elastomeric material can be compressed in a uniform and aesthetic fashion while being maintained in a virtually tensionless environment.

In one embodiment, the surface of the infused foam laminate and/or core body 12' opposite a surface coated with the waterproofing or water resistant elastomer 14 is coated with an intumescent material 16, according to embodiments. One type of intumescent material 16 may be a caulk having fire barrier properties. A caulk is generally a silicone, polyurethane, polysulfide, silyl-terminated-polyether, or polyurethane and acrylic sealing agent in latex or elastomeric base. Fire barrier properties are generally imparted to a caulk via the incorporation of one or more fire retardant agents. One preferred intumescent material 16 is 3M CP25WB+, which is a fire barrier caulk available from 3M of St. Paul, Minn. Like the elastomer 14, in one embodiment, the coating of the intumescent material 16 may be tooled or otherwise configured to create a "bellows" profile to facilitate the compression of the foam lamination and/or core body 12'.

After tooling or otherwise configuring to have the bellows-type of profile, if done, both the coatings of the elastomer 14 and the intumescent material 16 are cured in place on the foam 12 and/or core body 12' while the infused foam lamination and/or core body 12' is held at the prescribed compressed width.

Figure 2:
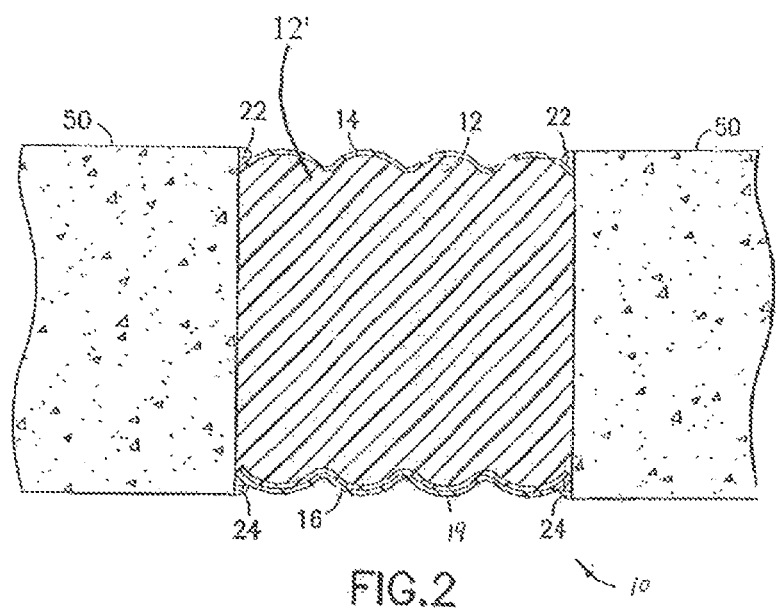
FIG. 2 is a schematic view of another embodiment of an expansion joint sealing system of the present invention.

In yet another embodiment, illustrated FIG. 2, the surface of the infused foam laminate and/or core body 12' opposite a surface coated with one or both of the waterproof or water resistant elastomer 14 and/or the intumescent material 16, is coated with a coating 19 having one or more of an EMP, EMI, RFI, electronic surveillance and/or EMR shielding/barrier characteristic, according to embodiments. One type of shielding coating 19 is an EMI/RFI Shielding Coating available from Master Bond, Inc. of Hackensack, N.J. Another type of shielding coating 19 is DOWSIL EC-6601 Electrically Conductive Adhesive available from The Dow Chemical Company of Midland, Mich. Still another type of shielding coating 19 is CHO-BOND 1016 or CHO-BOND 1019, electrically conductive silicone sealant available from Parker Hannifin Corporation of Cleveland, Ohio. Like the elastomer 14 and/or intumescent material 16, in one embodiment, the shielding coating 19 may be tooled or otherwise configured to create a "bellows" profile to facilitate the compression of the foam lamination and/or core body 12'.

After tooling or otherwise configuring to have the bellows-type of profile, if done, the coatings, for example, one or more of the elastomer 14, the intumescent material 16 and/or shielding coating 19 are cured in place on the foam 12 and/or core body 12' while the infused foam lamination and/or core body 12' is held at the prescribed compressed width. After the elastomer 14 and/or the intumescent material 16 and/or the shielding coating 19 have been cured, the foam 12 and/or core body 12' including one or more of the coatings, if any, is removed from the fixture, optionally compressed to less than the nominal size of the material and packaged for shipment to the job site.

In the embodiments described above, the elastomer 14 is applied on one surface and/or the intumescent material 16 and/or shielding coating 19 on an opposite surface, may be suited to horizontal applications where water resistance is desired on the top side and fire resistance and/or shielding is desired from beneath, as in the event of a fire or surveillance risk on the deck/floor below. As illustrated herein, the present invention is not limited to this embodiment, in that water resistance and/or fire resistance and/or EMP, EMI, RFI, electronic surveillance and/or EMR shielding/barrier characteristics may be including in any one or more direction or orientation of the expansion joint sealing system. Additionally, and as described below, an additional layer of the elastomer 14 may be applied over one or more of the intumescent material 16 and/or the shielding coating 19 to provide water resistance thereto.

In yet another embodiment of the system 10, a sealant band and/or corner bead 18 of the elastomer 14 can be applied on the side(s) of the interface between the foam laminate (and/or core body 12') and the concrete substrate 50 to create a water tight seal.

Figure 3:
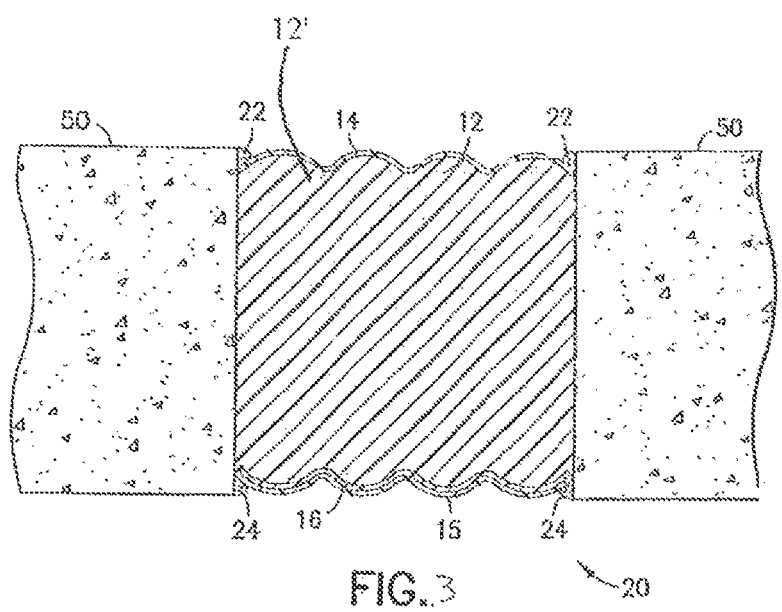
FIG. 3 is a schematic view of another embodiment of an expansion joint sealing system of the present invention.

Referring now to FIG. 3, an alternate expansion joint system 20 of the present invention illustrates the core body 12' having a first elastomer 14 coated on one surface and the intumescent material 16 coated on an opposing surface. A second elastomer 15 is coated on the intumescent material 16 and serves the function of waterproofing. In this manner, the system 20 is water resistant in both directions and fire resistant in one direction. The system 20 is used in applications that are similar to the applications in which the system 10 is used, but may be used where water is present on the underside of the expansion joint. Additionally, it would be suitable for vertical expansion joints where waterproofing or water resistance is desirable in both directions while fire resistance is desired in only one direction. The second elastomer 15 may also serve to aesthetically integrate the system 20 with surrounding substrate material. It should be appreciated that the present invention is not limited to this illustrated embodiment, as one or more of the intumescent material coating 16 or the shielding coating 19 may be coated by the second elastomer coating 15.

Sealant bands and/or corner beads 22 of the first elastomer 14 can be applied to the sides as with the embodiment described above. Sealant bands and/or corner beads 24 can be applied on top of the second elastomer 15, thereby creating a water tight seal between the concrete substrate 50 and the intumescent material.

Figure 4:
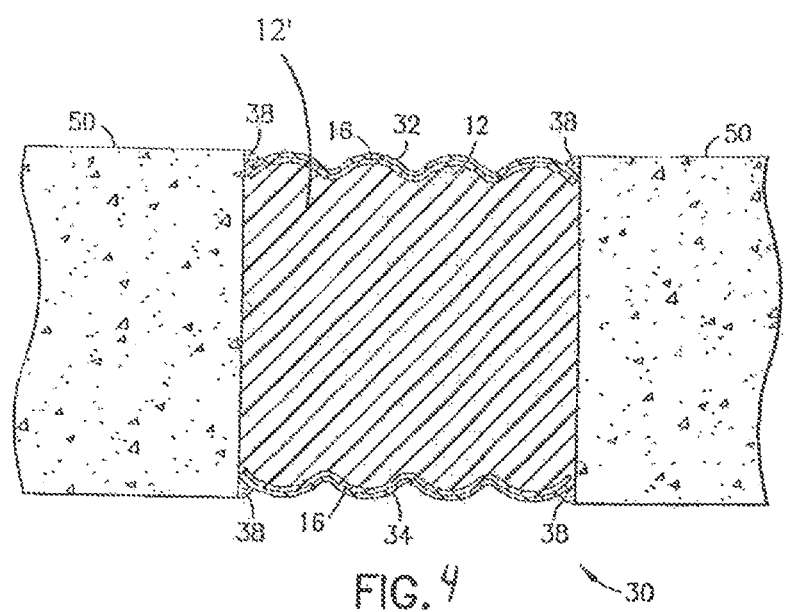
FIG. 4 is a schematic view of another embodiment of an expansion joint sealing system of the present invention.

Referring now to FIG. 4, another expansion joint sealing system of the present invention is shown at 30. In system 30, the foam 12 and/or core body 12' is similar to or the same as the above-described foam and/or core body 12', but both exposed surfaces are coated first with the intumescent material 16 to define a first coating of the intumescent material and a second coating of the intumescent material 16. The first coating of the intumescent material 16 is coated with a first elastomer material 32, and the second coating of the intumescent material 16 is coated with a second elastomer material 34. This system 30 can be used in the same environments as the above-described systems with the added benefit that it is both waterproof or at least water resistant and fire resistant in both directions through the joint. This makes it especially suitable for vertical joints in either interior or exterior applications. Once again, it should be appreciated that the present invention is not limited to this illustrated embodiment, as one or more of the intumescent material coating 16 or the shielding coating 19 may be coated by the first elastomer material 32 and the second elastomer coating 34 as shown in FIG. 4.

In system 30, sealant bands and/or corner beads 38 of the elastomer are applied in a similar fashion as described above and on both sides of the foam 12 and/or core body 12'. This creates a water tight elastomer layer on both sides of the foam 12 and/or core body 12'.

Figure 5:
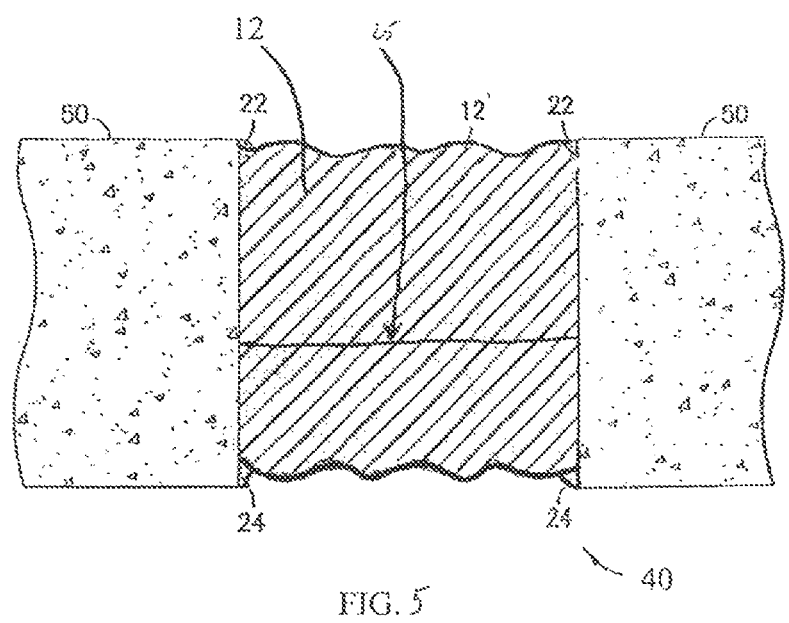
FIG. 5 is a schematic view of a further embodiment of an expansion joint sealing system of the present invention.

Referring now to FIG. 5, shown therein is another expansion joint sealing system 40, according to embodiments. In system 40, the core body 12' is introduced or infused with the water resistant material 62, fire retardant material 64 and/or EMP, EMI, RFI, electronic surveillance and/or EMR emanating shielding/barrier composition 66, as described above. In the system 40, the fire retardant material and/or EMP, EMI, RFI, electronic surveillance and/or EMR shielding/barrier composition can form a "sandwich type" construction, wherein the fire retardant material 64 and/or the shielding/barrier composition 66 forms a layer 25, as shown in FIG. 5, disposed in the material of core body 12'. Thus, the layer 25 comprising the fire retardant material 64 and/or the shielding/barrier composition 66 can be located within the body of the core 12' as, e.g., an inner layer, or lamination infused with a higher ratio or density of fire retardant material 64 and/or shielding/barrier composition 66 than the core body 12'. It is noted that the term "infused with" as used throughout the descriptions herein is meant to be broadly interpreted to refer to "includes" or "including." Thus, for example, "a core infused with a fire retardant material or shielding/barrier composition" covers a "core including a fire retardant material or shielding/barrier composition" in any form and amount, such as a layer, and so forth. Accordingly, as used herein, the term "infused with" would also include, but not be limited to, more particular embodiments such as "permeated" or "filled with" and so forth.

Moreover, it is noted that layer 25 is not limited to the exact location within the core body 12' shown in FIG. 5 as the layer 25 may be included at various depths in the core body 12' as desired. Moreover, it is further noted that the layer 25 may extend in any direction. For example, the layer 25 may be oriented parallel to the direction in which the joint extends, perpendicular to the direction in which the joint extends or combinations of the foregoing. The layer 25 can function as a fire resistant barrier layer and/or an EMP, EMI, RFI, electronic surveillance and/or EMR shielding/barrier layer within the core body 12'. Accordingly, layer 25 can comprise any suitable material providing, e.g., fire barrier and/or EMP, EMI, RFI, electronic surveillance and/or EMR shielding/barrier properties. In one embodiment, the EMP, EMI, RFI, electronic surveillance and/or EMR shielding/barrier layer is comprised of a fabric or mesh such as, for example, a EMF RF shielding copper fabric, EMF RF shielding nickel copper fabric, EMF RF shielding nickel copper rip-stop fabric, Adhesive EMF RF shielding nickel copper rip-stop fabric, EMF RF shielding black fabric, EMF RF shielding silver elastic fabric, or EMF RF shielding light filtering fine mesh available from Faraday Defense LLC, Hartford, Mich. No coatings are shown on the outer surfaces of core body 12' of FIG. 5. In one embodiment, the thickness of the EMP, EMI, RFI, electronic surveillance and/or EMR shielding/barrier layer 25 within the core body 12' may be between a range of about 0.01 inch to about 0.25 inch. In one embodiment, the desired range of frequency that can be blocked or shielded by the shielding/barrier layer 25 (or coating) is an attenuation of about >60 db for waves in 10 MHz-3 GHz range (e.g., when copper, nickel-copper, adhesive nickel-copper rip-stop, and black nickel-copper fabric is employed), about >55 db attenuation for waves in 10 MHz-3 GHz range (e.g., when nickel-copper rip-stop fabric is employed), about >50 db for waves in 10 MHz-3 GHz range (e.g., when light filtering mesh is employed), and about >60 db for waves in 14 kHz-10 GHz range (e.g., when silver elastic fabric is employed).

Accordingly, by tailoring the density as described above to achieve the desired introduction of water resistance, fire resistance and/or shielding/barrier properties to the structure, alone or combined with the fire resistance and/or shielding/barrier layer 25, and/or water resistant coating 14, intumescent coating 16 and/or shielding/barrier coating 19 on either or both outer surfaces of the core body 12', various embodiments of improved expansion joint sealing systems may be realized. It is noted that additional interior layers (two or more layers 25) could be employed if desired in the embodiment of FIG. 5, as well as in the other embodiments disclosed herein, and in any suitable combination and order.

Figure 6:
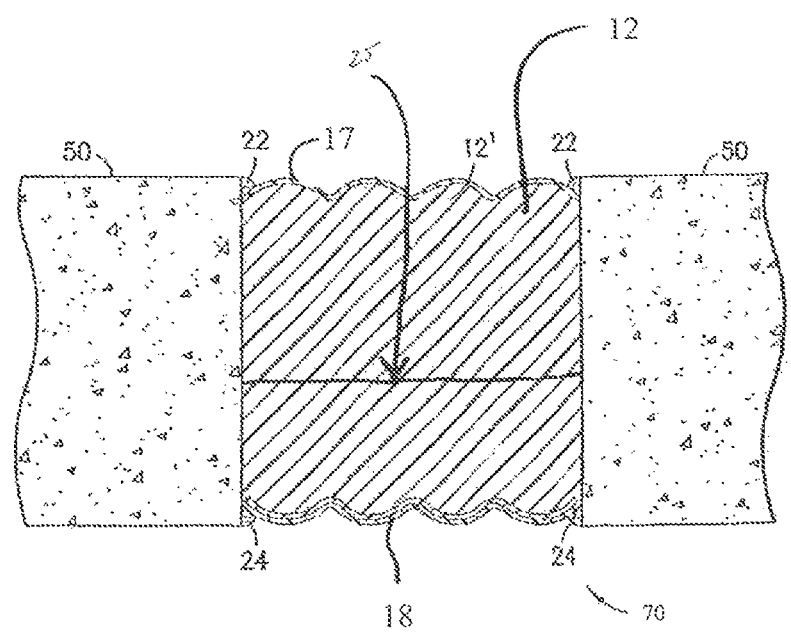
FIG. 6 is another embodiment of an expansion joint sealing system of the present invention.

In still another embodiment, the exterior coatings 14, 16, 19, 32 and 34 described above with respect to FIGS. 1, 2, 3 and 4 could be employed in the embodiments of FIG. 5 and/or FIG. 6 described below. As a further example, FIG. 6 illustrates therein an expansion joint sealing system 70 comprising the layer 25 comprising a fire retardant material 64 and/or shielding/barrier material 66 within the core body 12' as described above with respect to FIG. 5, and also comprising an additional coating 17 on a surface of the core 12'. Coating 17 can comprise any suitable coating, such as the elastomer 14 described above, a fire barrier material including an intumescent material 16, and/or a shielding/barrier coating 19 described above or other suitable fire barrier material, e.g., a sealant, a fabric, a blanket, a foil, a tape, e.g., an intumescent tape, a mesh, a glass, e.g., fiberglass; and combinations thereof.

Moreover, embodiments include various combinations of layering and fire retardant and/or shielding/barrier infusion (in layer and non-layer form) to achieve, e.g., the functioning of water resistant, fire resistant and/or EMP, EMI, RFI, electronic surveillance and/or EMR shielding/barrier expansion joint sealing systems described herein, according to embodiments. For example, FIG. 6 illustrates coating 17 on one surface of the core body 12' and a dual coating 18 on the opposite surface of the core body 12'. The dual coating 18 can comprise, e.g., an inner coating of elastomer 14, as described above, with an outer coating of a fire barrier material 16 including, e.g., an intumescent material, and/or an outer coating of an EMP, EMI, RFI, electronic surveillance and/or EMR shielding/barrier 19. Similarly, the coating of the dual coating 18 can be reversed to comprise an inner coating of fire barrier material 16 and/or shielding/barrier material 19, and an outer coating of elastomer 14.

Alternatively, only one coating may be present on either surface of core body 12', such as one coating of the fire resistant material 16 and/or the shielding/barrier material 19, e.g., sealant, on a surface of the core body 12', which is infused with a fire retardant material fire barrier and/or EMP, EMI, RFI, electronic surveillance and/or EMR shielding/barrier in the layer 25 or introduced in or infused within a non-layer form. Still further, other combinations of suitable coatings include, e.g., dual coating 18 on both surfaces of the core body 12' and in any combination of inner and outer coatings, as described above.

It is additionally noted that the embodiments shown in FIGS. 5 and 6 can be similarly constructed, as described above with respect to, e.g., the embodiments of FIGS. 1 to 4, modified as appropriate for inclusion/deletion of various layering, and so forth. Thus, for example, as described above, while a "bellows" construction is illustrated by the figures, the embodiments described herein are not limited to such a profile as other suitable profiles may be employed, such as straight, curved, and so forth. Although not illustrated, in one embodiment, EMP, EMI, RFI, electronic surveillance and/or EMR shielding/barrier fabric is disposed beneath an outer surface of the core body 12', for example, draped or looped below the other surface of the core body 12'. In still another embodiment, the EMP, EMI, RFI, electronic surveillance and/or EMR shielding/barrier fabric may wrap the core body 12'.

Accordingly, as further evident from the foregoing, embodiments of the water resistant, fire resistant and/or shielding/barrier expansion joint sealing systems can comprise various ordering and layering of materials on the outer surfaces of the core body 12'. Similarly, a fire retardant material and/or shielding/barrier material can be introduced in or infused into the core body 12' in various forms, to create, e.g., a layered "sandwich type" construction with use of, e.g., layer 25.

In the embodiments described herein, the infused foam laminate and/or core body 12' may be constructed in a manner which insures that substantially the same density of fire retardant 64 and/or shielding/barrier composition 66 is present in the product regardless of the final size of the product, according to embodiments. The starting density of the infused foam/core body is approximately 140 kg/m$^3$, according to embodiments. Other suitable densities include between about 50 kg/m$^3$ and about 250 kg/m$^3$, and between about 80 kg/m$^3$ and about 180 kg/m$^3$. After compression, the infused foam/core body density is in the range of about 160 kg/m$^3$ to about 800 kg/m$^3$, according to embodiments. After installation the laminate and/or core body 12' will typically cycle between densities of approximately 750 kg/m$^3$ at the smallest size of the expansion joint to approximately about 360 kg/m$^3$ to about 450 kg/m$^3$, e.g., approximately about 400 kg/m$^3$ to about 450 kg/m$^3$ (or less than 400 kg/m$^3$) at the maximum size of the joint. A density of about 400 kg/m$^3$ to about 450 kg/m$^3$ was determined through experimentation, as a reasonable value which still affords adequate fire retardant capacity, such that the resultant composite (e.g., the infused foam laminate and/or core body 12') can pass the UL 2079 test program for movement cycling and fire endurance testing. For example, embodiments of the present invention described herein pass (e.g., perform in accordance with) the requirements of UL 2079 which includes cycling through an intended range of movement, e.g., movement cycling testing as described in any of the three (3) conditions specified in Table 9.1 (UL 2079 Section 9), and thereafter resisting or enduring (e.g., withstanding) temperatures for a specified time period as illustrated on the time-temperature curve, e.g., fire endurance testing (UL 2079 Sections 11, 16.5 and 23.1). When embodiments described herein include EMP, EMI, RFI, electronic surveillance and/or EMR shielding/barrier properties, compliance with U.S. TEMPEST standards, and equivalents, is realized, which includes, for example, blocking and/or shielding a desired range of frequency of an attenuation of between about >50 db to about >60 db for waves in a range of about 14 kHz-10 GHz range, and in embodiments, a range of about 10 MHz-3 GHz, while also maintaining the aforementioned ability to cycle (e.g., expand and contract) to accommodate the movement of substrates between which the system is compressed.

It should be appreciated that the present invention is not limited to cycling in the foregoing ranges, however, and the foam/core may attain densities outside of the herein-described ranges (e.g., to density below about 400 kg/m$^3$, and above about 750 to 800 kg/m$^3$). As described above, acceptable or preferred performance of expansion joint sealing systems designed in accordance with the present invention requires a balance of a backpressure provided by the organic structure of the un-infused, un-impregnated foam and/or core body (e.g., the organic cellular structure of the un-infused foam or core) and an amount of a component (liquid or solid) put into the organic structure by introduction, by infusion, by impregnation and other equivalent processes, as the amount of the component put into the structure, whether it is the water resistant chemistry 62, the fire retardant material 64, or the shielding/barrier composition 66, affects the degree to which the backpressure of the un-introduced, un-infused, or un-impregnated, foam or core body is dampened or restrained by the component. As such, the amount of the component introduced, infused or impregnated do not adversely affect the system's ability to cycle (expand and contract) to accommodate the movement of substrates between which the system is compressed to maintain the seal provided by the expansion joint sealing system. Similarly, layers disposed within and/or coatings applied to the foam 12 or core body 12' do not adversely affect the system's ability to cycle (expand and contract) to accommodate the movement of substrates between which the system is compressed to maintain the seal provided by the expansion joint sealing system.

In horizontal expansion joint systems, installation is accomplished by adhering the foam laminate and/or core body 12' to the concrete substrates using an adhesive such as epoxy, according to embodiments. The epoxy or other adhesive is applied to the faces of the expansion joint prior to removing the foam laminate and/or core body 12' from the packaging thereof (such packaging may comprise restraining elements, straps, ties, bands, shrink wrap plastic, or the like). Once the packaging has been removed, the foam laminate and/or core body 12' will begin to expand, and it should be inserted into the joint in the desired orientation further to the application of epoxy or other adhesive materials to the side(s) of the foam laminate and/or core body 12' if so desired. Once the foam lamination and/or core body 12' has expanded to suit the expansion joint, it will become locked in between the substrates forming the expansion joint by the combination of the foam back pressure and the adhesive.

In vertical expansion joint systems, an adhesive band may be pre-applied to the foam lamination and/or core body 12'. In this case, for installation, the foam laminate and/or core body 12' is removed from the packaging and simply inserted into the space between the concrete surfaces (e.g., in the expansion joint) to be joined where it is allowed to expand to meet the concrete substrates. Once this is done, the adhesive band in combination with the back pressure of the foam 12 and/or core body 12' will hold the foam 12 and/or core body 12' in position between the substrates forming the expansion joint.

To fill an entire expansion joint, the installation as described above is repeated as needed over the length of the expansion joint. To join the end of one foam laminate and/or core body 12' to the end of another in either the horizontal configuration or the vertical configuration, a technique similar to that used with the sealant band and/or corner beads can be employed. After inserting one section of a joint sealing system in the joint and adhering it securely to the concrete substrates, the next section is readied by placing it in proximity to the first section. A band or bead of the intumescent material and the elastomer material is applied on the end of the foam laminate in the appropriate locations. The next section is removed from the packaging and allowed to expand in close proximity to the previously installed section. When the expansion has taken place and the section is beginning to adhere to the substrates (joint faces), the section is firmly seated against the previously installed section. The outside faces are then tooled to create an aesthetically pleasing seamless interface.

The above mentioned installation procedure is simple, rapid, and has no invasive elements which impinge upon or penetrate the concrete (or other) substrates. This avoids many of the long term problems associated with invasive anchoring of screws into expansion joint faces.

It is further noted that the various embodiments, including constructions, layering, coatings and so forth described herein, can be combined in any combination and in any order to result in, e.g., a water resistant, fire resistant and/or EMP, EMI, RFI, electronic surveillance and/or EMR shielding/barrier expansion joint sealing system. Thus, the embodiments described herein are not limited to the specific construction of the figures, as the various materials, layering, coatings, and so forth described herein can be combined in any desired combination and order. For example, the expansion joint sealing systems and the architectural joint sealing systems of the present invention provide shielding to insulate or provide a barrier in the building structure from penetration of naturally occurring and/or man-made EMPs, EMI, RFI, and electronic surveillance including the unauthorized interception of communication, transmission and/or EMR emanating from computer and/or telecommunication devices with or without one or both of the aforementioned water resistant and/or fire resistant properties, by including, in one embodiment, the shielding or barrier in an interior layer 25, for example, sandwiched between the material of the foam or core body, in another embodiment, by a choice of chemistry used to form a foam within a foaming process, or by a chemistry used as an infusion/impregnation composition that provides the shielding or barrier properties, in yet another embodiment by a fabric or a coating applied to a surface of the foam or core body, or disposed within the foam or core body, to provide the shielding or barrier properties, and in still another embodiment, by a fabric that is disposed outside of the foam or core body, e.g., draped or looped behind or under the expansion joint sealing system to provide the shielding or barrier properties below the system.

Although this invention has been shown and described with respect to the detailed embodiments thereof, it will be understood by those of skill in the art that various changes may be made and equivalents may be substituted for elements thereof without departing from the scope of the invention. In addition, modifications may be made to adapt a particular situation or material to the teachings of the invention without departing from the essential scope thereof. Therefore, it is intended that the invention not be limited to the particular embodiments disclosed in the above detailed description, but that the invention will include all embodiments falling within the scope of this disclosure.

What is claimed is:

1. An expansion joint sealing system that is attached to two adjacent building substrates in a building structure, the expansion joint sealing system comprising:
   a core body; and
   an electronic shielding material introduced in the core body;
   wherein the core body including the electronic shielding material is configured to expand and contract between the building substrates forming an expansion joint to accommodate movement of the building substrates, to pass movement cycling testing of UL 2079, to maintain a seal of the expansion joint, and to attenuate a range of frequencies through the expansion joint.

2. The expansion joint sealing system of claim 1, wherein the electronic shielding material is selected from the group consisting of aluminum, copper, graphite, silver, boron, gold, silver-plated aluminum, nickel-plated graphite, and combinations of the foregoing materials.

3. The expansion joint sealing system of claim 1, further including a layer disposed within the core body, the layer comprised of the electronic shielding material embedded in the core body.

4. The expansion joint sealing system of claim 3, wherein the layer is comprised of an electronic shielding fabric or mesh.

5. The expansion joint sealing system of claim 3, wherein the layer of electronic shielding material has a thickness of between a range of about 0.01 inch to 0.25 inch.

6. The expansion joint sealing system of claim 1, wherein an additional material is introduced into the core body and is selected from the group consisting of an acrylic, a wax, an ultraviolet stabilizer, a polymeric material, and combinations of the foregoing materials.

7. The expansion joint sealing system of claim 1, further including a coating disposed on an outer surface of the core body.

8. The expansion joint sealing system of claim 7, wherein the coating is comprised of an elastomer.

9. The expansion joint sealing system of claim 8, wherein the elastomer is selected from the group consisting of silicone, polysulfides, acrylics, polyurethanes, poly-epoxides, silyl-terminated polyethers, and combinations of one or more of the foregoing.

10. The expansion joint sealing system of claim 7, wherein the coating is comprised of a fire barrier sealant, and the core body having the fire barrier sealant coating is configured to pass movement cycling testing and fire endurance testing of UL 2079.

11. The expansion joint sealing system of claim 10, wherein the fire barrier sealant is comprised of a fire resistant caulk.

12. The expansion joint sealing system of claim 7, wherein the coating is comprised of at least one of an EMP, EMI, RFI, electronic surveillance and EMR shielding coating.

13. The expansion joint sealing system of claim 1, wherein an additional material is introduced into the core body and is a fire retardant material, and the core body including the fire retardant material is configured to pass movement cycling testing and fire endurance testing of UL 2079.

14. The expansion joint sealing system of claim 13, wherein the fire retardant material is aluminum tri-hydroxide.

15. The expansion joint sealing system of claim 13, wherein the fire retardant material is selected from the group consisting of aluminum trihydroxide, expandable graphite and other carbon-based derivatives that may impart fire resistance or retardation, metal oxides and other metal hydroxides, aluminum oxides, antimony oxides and hydroxides, iron compounds such as ferrocene, molybdenum trioxide, nitrogen-based compounds, phosphorus based compounds, halogen based compounds, halogens, including fluorine, chlorine, bromine, iodine, astatine, compounds capable of suppressing combustion and smoke formation, and combinations of any of the foregoing materials.

16. The expansion joint sealing system of claim 1, wherein the core body is comprised of a material selected from the group consisting of foam, a paper based product, metal, plastic, thermoplastic, and combinations thereof.

17. The expansion joint sealing system of claim 1, wherein the core body comprises at least one of polyurethane foam, polyether foam, open cell foam, dense closed cell foam, cross-linked foam, neoprene foam rubber, urethane, cardboard, and a composite.

18. The expansion joint sealing system of claim 1, wherein the core body is selected from the group consisting of a plurality of laminations, a solid block, and combinations thereof.

19. The expansion joint sealing system of claim 1, wherein the electronic shielding material is comprised of a material that insulates from penetration of at least one of a naturally occurring and a man-made one of an electromagnetic pulse (EMP), electromagnetic interference (EMI), radio frequency interference (RFI), electronic surveillance, and electromagnetic radiation (EMR).

20. The expansion joint sealing system of claim 1, wherein the core body including the electronic shielding material is configured to attenuate waves having a frequency in a range of about 14 kHz-10 GHz to a degree of >50 db.

21. An expansion joint sealing system that is attached to two adjacent building substrates in a building structure, the expansion joint sealing system comprising:
   a core body; and
   a layer of an electronic shielding material introduced in the core body;
   wherein the core body including the layer of the electronic shielding material is configured to expand and contract between the building substrates forming an expansion joint to accommodate movement of the building substrates, to pass movement cycling testing of UL 2079, to maintain a seal of the expansion joint, and to attenuate a range of frequencies through the expansion joint.

22. The expansion joint sealing system of claim 21, wherein the electronic shielding material is comprised of a material that insulates from penetration of at least one of a naturally occurring and a man-made one of an electromagnetic pulse (EMP), electromagnetic interference (EMI), radio frequency interference (RFI), electronic surveillance, and electromagnetic radiation (EMR).

23. The expansion joint sealing system of claim 21, wherein the core body including the layer of electronic shielding material is configured to attenuate waves having a frequency in a range of about 14 kHz-10 GHz to a degree of >50 db.

24. The expansion joint sealing system of claim 21 wherein the layer of the electronic shielding material has a thickness of between a range of about 0.01 inch to 0.25 inch.

25. The expansion joint sealing system of claim 21, further including a fire retardant material introduced into the core body, and the core body including the fire retardant material and the layer of the electronic shielding material are configured to pass movement cycling testing and fire endurance testing of UL 2079.

26. An expansion joint sealing system that is attached to two adjacent building substrates in a building structure, the expansion joint sealing system comprising:
   a core body; and
   an electronic shielding material disposed beneath an outer surface of the core body;
   wherein the core body and the electronic shielding material are configured to expand and contract between the building substrates forming an expansion joint to accommodate movement of the building substrates, to pass movement cycling testing of UL 2079, to maintain a seal of the expansion joint, and to block a attenuate a range of frequencies through the expansion joint.

27. The expansion joint sealing system of claim 26, wherein the electronic shielding material is comprised of a material that insulates from penetration of at least one of a naturally occurring and a man-made one of an electromagnetic pulse (EMP), electromagnetic interference (EMI), radio frequency interference (RFI), electronic surveillance, and electromagnetic radiation (EMR).

28. The expansion joint sealing system of claim 26, wherein the core body including the electronic shielding material disposed beneath the outer surface of the core body is configured to attenuate waves having a frequency in a range of about 14 kHz-10 GHz to a degree of >50 db.

29. The expansion joint sealing system of claim 26, further including a fire retardant material introduced into the core body, and the core body including the fire retardant material and the electronic shielding material disposed beneath the outer surface of the core body are configured to pass movement cycling testing and fire endurance testing of UL 2079.

30. The expansion joint sealing system of claim 26, wherein the electronic shielding material is at least one of draped and looped below the outer surface of the core body.

31. The expansion joint sealing system of claim 26, wherein the electronic shielding material is comprised of fabric.

32. An expansion joint sealing system that is attached to two adjacent building substrates in a building structure, the expansion joint sealing system comprising:
   a core body; and
   a coating of an electronic shielding material disposed on an outer surface of the core body;
   wherein the core body including the coating of the shielding material are configured to expand and contract between the building substrates forming an expansion joint to accommodate movement of the building substrates, to pass movement cycling testing of UL 2079, to maintain a seal of the expansion joint, and to attenuate a range of frequencies through the expansion joint.

33. The expansion joint sealing system of claim 32, wherein the electronic shielding material is comprised of a material that insulates from penetration of at least one of a naturally occurring and a man-made one of an electromagnetic pulse (EMP), electromagnetic interference (EMI), radio frequency interference (RFI), electronic surveillance, and electromagnetic radiation (EMR).

34. The expansion joint sealing system of claim 32, wherein the core body including the coating is configured to attenuate waves in a range of about 14 kHz-10 GHz to a degree of >50 db.

35. The expansion joint sealing system of claim 32, further including a fire retardant material introduced into the core body, and the core body including the fire retardant material and the coating of the electronic shielding material is configured to pass movement cycling testing and fire endurance testing of UL 2079.

* * * * *